United States Patent
Cohen et al.

(10) Patent No.: US 7,456,081 B2
(45) Date of Patent: Nov. 25, 2008

(54) IN-PLACE BONDING OF MICROSTRUCTURES

(75) Inventors: Guy M. Cohen, Mohegan Lake, NY (US); Patricia M. Mooney, Mount Kisco, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/751,342

(22) Filed: May 21, 2007

(65) Prior Publication Data
US 2007/0212851 A1 Sep. 13, 2007

Related U.S. Application Data

(62) Division of application No. 10/978,551, filed on Nov. 1, 2004, now Pat. No. 7,238,589.

(51) Int. Cl.
*H01L 21/50* (2006.01)
(52) U.S. Cl. ............... 438/455; 257/E21.088
(58) Field of Classification Search .......... 438/455; 257/E21.088
See application file for complete search history.

(56) References Cited

U.S. PATENT DOCUMENTS

| | | | |
|---|---|---|---|
| 4,933,601 A | 6/1990 | Sagawa et al. |
| 5,473,192 A | 12/1995 | Golubic et al. |
| 5,923,091 A | 7/1999 | Nagai |
| 6,666,979 B2 | 12/2003 | Chinn et al. |
| 6,767,802 B1 | 7/2004 | Maa et al. |
| 6,858,518 B2 | 2/2005 | Kondo |
| 7,041,178 B2 | 5/2006 | Tong et al. |
| 2002/0182775 A1 | 12/2002 | Belford |
| 2003/0006416 A1 | 1/2003 | Dudoff et al. |
| 2003/0013287 A1 | 1/2003 | Lochtefeld et al. |
| 2003/0186073 A1 | 10/2003 | Fitzgerald |
| 2004/0029356 A1 | 2/2004 | Timme et al. |
| 2004/0075141 A1 | 4/2004 | Maeda et al. |
| 2004/0126958 A1 | 7/2004 | Usuda et al. |
| 2004/0251464 A1 | 12/2004 | Lee |
| 2004/0253792 A1 | 12/2004 | Cohen et al. |
| 2005/0020094 A1 | 1/2005 | Forbes et al. |
| 2005/0227455 A1 | 10/2005 | Park et al. |

(Continued)

OTHER PUBLICATIONS

Rikard A. Wind, et al. "Fabrication of Nanoperiodic Surface Structures by Controlled Etching of Dislocations in Bicrystals" Applied Physics Letters, Apr. 9, 2001, pp. 2205-2207, vol. 78, No. 15.

(Continued)

*Primary Examiner*—George Fourson
(74) *Attorney, Agent, or Firm*—Scully, Scott, Murphy & Presser, P.C.; Ido Tuchman, Esq.

(57) ABSTRACT

A method for bonding microstructures to a semiconductor substrate using attractive forces, such as, hydrophobic, van der Waals, and covalent bonding is provided. The microstructures maintain their absolute position with respect to each other and translate vertically onto a wafer surface during the bonding process. The vertical translation of the micro-slabs is also referred to herein as "in-place bonding". Semiconductor structures which include the attractively bonded microstructures and substrate are also disclosed.

1 Claim, 11 Drawing Sheets

U.S. PATENT DOCUMENTS

2006/0011982 A1* 1/2006 Forbes .................. 257/347

OTHER PUBLICATIONS

Vamsi K. Paruchuri, et al. "The Effect of Cosurfactants on Sodium Dodecyl Sulfate Micellar Structures at a Graphite Surface" Colloids and Surfaces A: Physiochem. Eng. Aspects, 2006, pp. 157-163.

P.M. Mooney, et al. "Elastic Strain Relaxation in Free-Stainding SiGe/Si Structures" Applied Physics Letters, Feb. 16, 2004, pp. 1093-1095, vol. 84, No. 7.

* cited by examiner

IN-PLACE BONDING OF MICROSTRUCTURES

RELATED APPLICATION

This application is a divisional application of U.S. Ser. No. 10/978,551, filed Nov. 1, 2004, now U.S. Pat. No. 7,238,589.

FIELD OF THE INVENTION

The present invention relates to semiconductor substrates, and more particularly to a semiconductor substrate having bonded microstructures. The microstructures within the inventive semiconductor substrates can incorporate strained films or different crystal orientation than that of the substrate. The microstructures are formed prior to their bonding to the substrate.

BACKGROUND OF THE INVENTION

In the semiconductor industry, wafer bonding is conventionally performed by methods where a first substrate is bonded to a second substrate and then the bulk of the first substrate is removed leaving a thin layer from the first substrate on the surface of the second substrate. The first substrate is usually referred to as the donor wafer, while the second substrate is referred to as the handle wafer. The transfer of the thin film from the donor wafer to the handle wafer can be achieved by known methods such as wafer back grinding, or hydrogen blistering (a process known as SmartCut). In all of these wafer bonding techniques, a continuous film is transferred from a donor wafer to a handle wafer, and the bonding takes place between two wafers.

Wafer bonding carried out by the techniques discussed above presents many challenges. For example and in conventional techniques, the transfer of the thin film from the donor wafer to the handle wafer requires a high temperature anneal (on the order of about 350° C. or greater). Thus, if the Smart-Cut approach is used, a first anneal is required to strengthen the bonding between the two wafers, while a second anneal at a higher temperature is required to activate the hydrogen blistering. No room temperature process for layer transfer has been reported so far.

Particles can substantially impact the yield of wafers bonded by conventional methods. As an example, a single particle with a radius of 0.1 micrometer can form a void (i.e., an unbonded area) of 1.0 millimeter radius. Thus, an ultra clean environment is required to obtain a void-free bonded wafer.

In addition to the particle-free surface requirement, the surfaces of the donor and handle wafers are required to be very smooth to enable bonding. A typical surface roughness of less than 0.5 nm (RMS) is usually specified. Some deposited films exceed a surface roughness of 0.5 nm, and a chemical mechanical polishing (CMP) step is used to smooth the surface prior to bonding.

Achieving a clean interface between the transferred film and the handle wafer is important if the transferred film is to be electrically connected to the substrate. As an example and in the case of silicon, hydrophobic bonding is required to obtain an Ohmic contact between the transferred film and the substrate. The silicon donor wafer and the silicon handle wafer surfaces are stripped of any oxide and then passivated to prevent the growth of a native oxide or otherwise the bonding interface will include an oxide film. The passivation of the bare silicon surface, typically achieved by a hydrofluoric acid (HF) last dip, is volatile and prevents oxide growth for only a short period of time (e.g., about 20 min at room temperature). Thus, the time window for bonding the two silicon wafers is very short.

Given the above challenges with prior art wafer bonding processes, a bonding and film transfer method that can be performed at a low temperature (e.g., room-temperature), is less sensitive to particles and surface roughness, and provides a clean bonding interface is highly desirable.

SUMMARY OF THE INVENTION

The present invention provides a method for bonding microstructures to a semiconductor substrate using attractive forces, such as, hydrophobic, van der Waals, and covalent bonding. The microstructures, hereinafter referred to as micro-slabs, maintain their absolute position with respect to each other and translate vertically onto a wafer surface during the bonding process. The terms "microstructuress" and "micro-slabs" are interchangeably used in the present invention to denote a structure whose size is in the microns range or less (for example, less than 200 µm). The vertical translation of the micro-slabs is also referred to herein as "in-place bonding".

The in-place bonding technique provided by the present invention has several applications as summarized below: In a first aspect of the invention, the technique is applied to fabricate a wafer having isolated single-crystal semiconductor regions that may be strained and/or may have a different crystal orientation than that of the substrate. As an example, strained-silicon micro-slabs are hydrophobically bonded to a silicon substrate, thus realizing strained-silicon directly on silicon (SSDOS). In another example, silicon micro-slabs with a 110 crystal orientation are hydrophobically bonded to a silicon substrate with a 100 crystal orientation, thus realizing a hybrid orientation substrate (where the two silicon regions having different crystal orientations are not separated by an insulator).

In a second aspect of the present invention, a method for hydrophobic bonding of micro-slabs is disclosed. In contrast to conventional methods where a continuous layer is bonded to the substrate and then patterned into micro-slabs, the present invention provides a method where already formed micro-slabs are bonded to a wafer while maintaining their exact location (in-place bonding).

A wafer, such as a silicon-on-insulator (SOI) wafer, is patterned such that separated silicon micro-slabs are formed over the buried oxide (BOX). The BOX is then wet etched in diluted hydrofluoric acid (HF) so that the oxide is undercut. When enough undercut is obtained, the exposed surfaces of the silicon micro-slab and of the substrate are attracted to each other due to hydrophobic forces and bond. As the etching progresses, the newly exposed silicon surfaces of the micro-slab and substrate bond together. Full bonding of the micro-slab to the substrate is achieved once all the buried oxide has been etched away.

The method of the present invention, which has been broadly described above, has the following advantages over conventional wafer bonding methods: The bonding of two wafers and the layer transfer process is replaced in the present invention by progressive layer translation and bonding, all which are done at room temperature. Moreover, the inventive process is less sensitive to particles for two reasons: First, a particle will only prevent the bonding of a single micro-slab, as opposed to a large area as in conventional wafer bonding. Second, the thin micro-slabs are much more flexible than a continuous film attached to a thick substrate, thus the unbonded area, due to a particle, can be roughly of the size of the particle.

Additionally, since the bonding is performed in an etching solution by etching an oxide and bonding the exposed surfaces of the SOI film and the substrate, the resultant interface is clean and substantially oxide free. Therefore, an Ohmic contact to the substrate or, alternatively, a high quality p-n junction can be realized between the micro-slab and the substrate.

The bonding method of the present invention can be used to fabricate strained-silicon directly on silicon: A pseudomorphic, compressively strained SiGe film is epitaxially grown on a thin SOI layer and is capped by growing an epitaxial silicon film having a thickness similar to that of the SOI film. The tri-layer film is then patterned into micro-slabs, and the BOX is undercut by etching in HF acid. The strained SiGe film overlapping the undercut portion of the micro-slab relaxes elastically (without defect introduction) since it is no longer held firmly by the buried oxide and substrate. The relaxation of the SiGe film induces tensile strain in the SOI film and the silicon cap film. The magnitude of the strain transferred to the SOI film depends on the ratio of the thickness of the SiGe to the sum of the thicknesses of the SOI and Si cap films (see, for example, P. M. Mooney, et al., Appl. Phys. Lett. 84, 1093 (2004)). As described above, the exposed surfaces of the silicon micro-slab (bottom SOI surface) and of the substrate are attracted due to hydrophobic forces and bond as the etching progresses. Full bonding of the tri-layer Si/SiGe/Si slab to the substrate is achieved once all the buried oxide is etched. Annealing followed by removal of the top Si layer and the SiGe layer by selective wet etching leaves a Si micro-slab under tensile strain bonded directly to Si.

In a third aspect of the present invention, hydrophobic bonding of micro-slabs to a dielectric surface is described. The dielectric surface may not be naturally hydrophobic, but can be made hydrophobic by the use of a surfactant. Combining this aspect of the present invention with the method described above for making strained-silicon micro-slabs provides a method for forming strained-silicon directly on insulator.

BRIEF DESCRIPTION OF THE DRAWINGS

FIGS. 8A-8D show experimental data for two of the embodiments of the present invention.

DETAILED DESCRIPTION OF THE INVENTION

The present invention, which provides semiconductor substrates with bonded micro-slabs as well as a method of forming the same, will now be described in greater detail by referring to the following discussion. In this discussion, reference will be made to various drawings that illustrate embodiments of the present invention. Since the drawings of the embodiments of the present invention are provided for illustrative purposes, the structures contained therein are not drawn to scale.

Figure 1A:
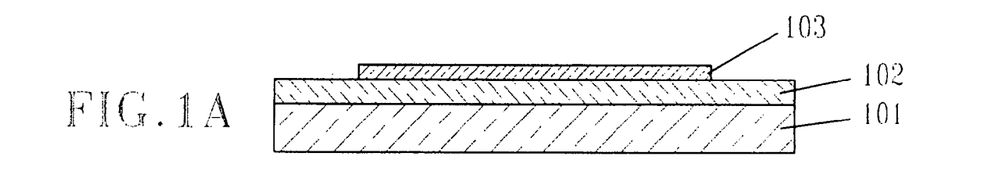
FIGS. 1A-1E are pictorial representations (through cross sectional views) illustrating the basic processing steps of the present in-place bonding method.
Figure 1B:
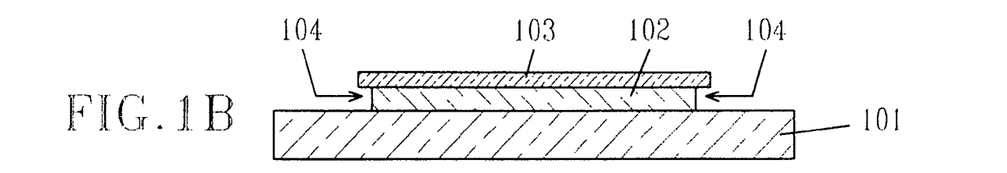
Figure 1C:
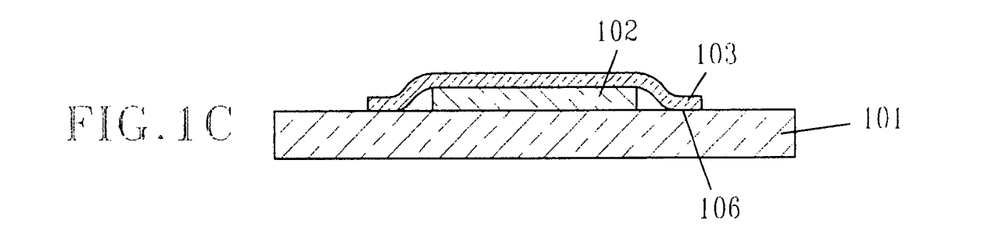
Figure 1D:
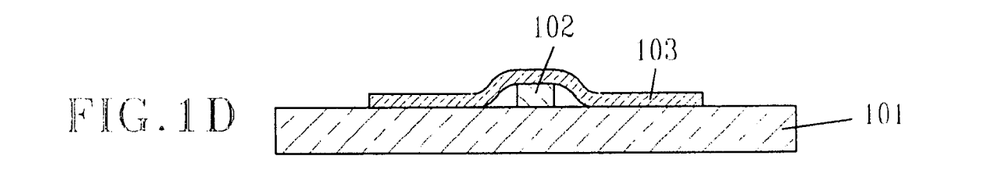
Figure 1E:
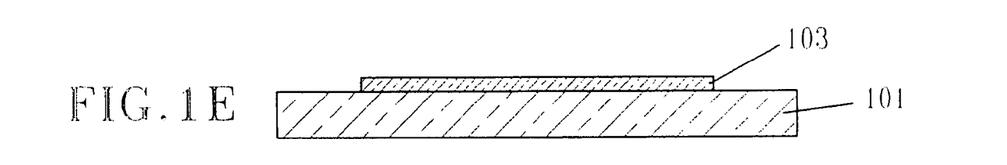

The invention uses the attraction between two closely spaced hydrophobic surfaces to achieve in-place hydrophobic bonding of a microstructure (i.e., micro-slab) to a substrate. The basic method is shown in FIGS. 1A-1E which illustrate an example where a SOI film, i.e., micro-slab, 103 is hydrophobically bonded to a silicon substrate 101. A silicon-on-insulator (SOI) wafer is used as the starting substrate. The SOI substrate is readily manufactured by conventional techniques such as wafer bonding or by separation by implantation of oxygen (SIMOX). The SOI film is patterned into isolated regions as shown in FIG. 1A forming micro-slabs 103. The patterning can be performed by conventional lithography and reactive ion etching (RIE). The buried oxide 102 is then undercut 104 by etching in hydrofluoric acid (HF) (FIG. 1B). The free-standing silicon surface and the substrate surface are both hydrophobic and are therefore attracted to each other in the etchant bath. As shown in FIG. 1C, after additional etching the free-standing silicon surface is pulled to the substrate surface and bonds 105 to the substrate surface. As the etch continues (FIG. 1D) more silicon surface is stripped of the oxide, and more bonding takes place between the free-standing slab and the substrate. The process terminates when all the buried oxide is consumed and the silicon micro-slab 103 lies flat on the substrate (FIG. 1E). When the substrate is dried, the micro-slab remains bonded to the substrate by van der Waals forces. The bond can then be strengthened by a high-temperature anneal. For example, bond strengthening can occur utilizing an annealing temperature from about 300° C. to about 1100° C. Annealing will form a covalent bond between the bonded micro-slab 103 and the substrate 101.

It should be noted that the above represents one possible embodiment of the present invention, and that the present invention also contemplates the in-place bonding of other hydrophic surfaces. For example, the SOI layer 103 can be replaced by a SiGe layer or another type of semiconductor material. Likewise, the substrate 101 can be replaced with another type of semiconductor material. In one embodiment, the substrate 101 is a SOI substrate that includes at least one of Si, Ge and diamond. Moreover, although the etching is specified as being performed using an HF etchant, the present invention also contemplates other types of etchants that can selectively etch the BOX 102. In addition, the present invention also contemplates substituting the BOX 102 with other types of buried sacrificial materials such as semiconductors, nitrides and oxynitrides. In such an embodiment, the etchant used to remove the buried insulating layer is chosen to selectively remove the specific type of buried sacrificial material present.

The method of the present invention described above has several applications. The first of these applications is strained-silicon directly on silicon (SSDOS). Strained-silicon can enhance the mobility of the carriers in a metal oxide semiconductor field effect transistor (MOSFET) channel and therefore increase the device current drive. FIGS. 2A-2E illustrate the basic processing steps used to fabricated strained-silicon directly on silicon.

Figure 2A:
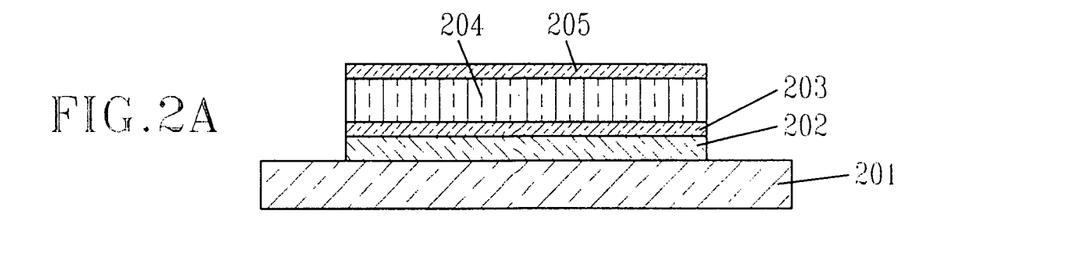
FIGS. 2A-2E are pictorial representations (through cross sectional views) illustrating the basic processing steps used in the present invention for fabricating a strained-silicon directly on silicon.

FIG. 2A illustrates a cross-sectional view of a silicon substrate 201 having patterned tri-layer micro-slabs consisting of silicon 203, a pseudomorphic (fully-strained) SiGe layer 204, and a silicon cap layer 205, on a buried oxide (BOX) 202. The silicon slab 203 and the silicon cap 205 have a similar thickness, and their combined thickness is typically less than the thickness of the SiGe film 204. To fabricate the structure of FIG. 2A, a SiGe film 204 is grown epitaxially on a SOI film 203, and then capped by an epitaxially grown Si film 205. The SiGe and Si epitaxy can be performed by conventional methods such as, for example, chemical vapor deposition (CVD) and molecular beam epitaxy (MBE). The patterning of the tri-layer into micro-slabs is done by conventional lithography and etching such as reactive-ion etching (RIE). An HBr based chemistry or the like can be used to etch selectively the tri-layer Si/SiGe/Si micro-slab with respect to the BOX 202.

Figure 2B:
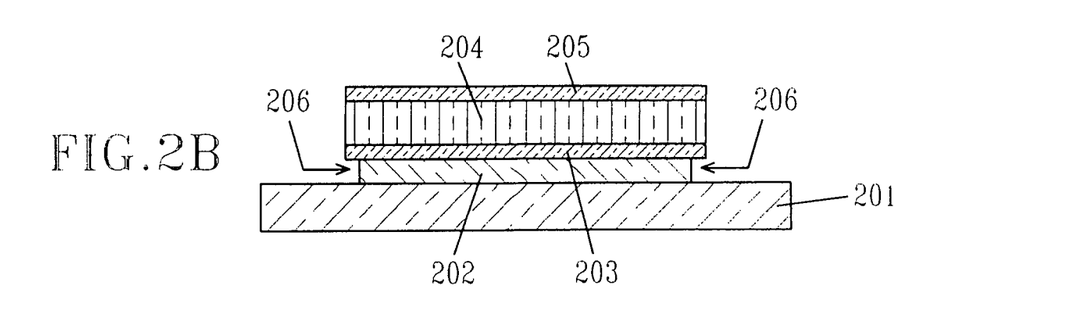

FIG. 2B shows the wet etching 206 of the BOX 202 in diluted hydrofluoric acid (HF) so that the BOX 202 is undercut. The free-standing portion of the SiGe film 204 relaxes elastically and induces tensile strain in the free-standing portion of the bottom Si 203 film and the top Si 205 film. The degree of strain sharing between the SiGe film 204 and silicon films 203 and 205 depends on their thickness ratio. To maximize the strain transfer from the SiGe film 204 to the silicon films 203 and 205, the SiGe film has to be thicker than the combined silicon films. A thickness ratio of 10:1 is typically achievable and provides over 90% strain transfer from the SiGe to the Si layers.

Figure 2C:
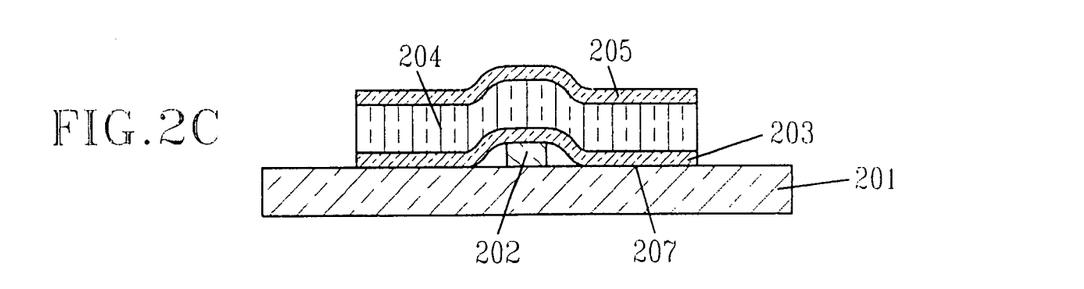
Figure 2D:
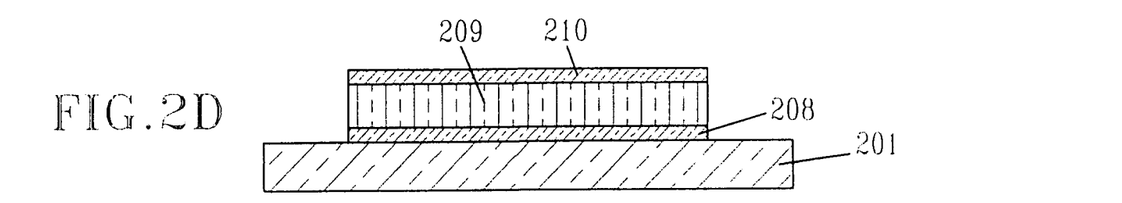
Figure 2E:
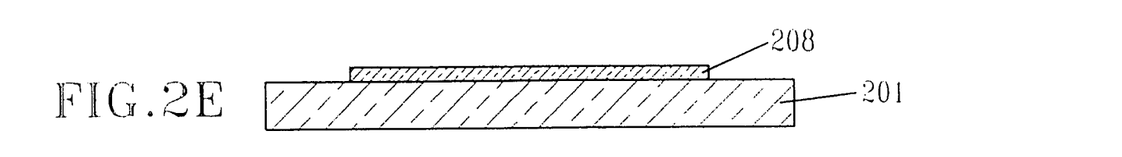
Figure 3A:
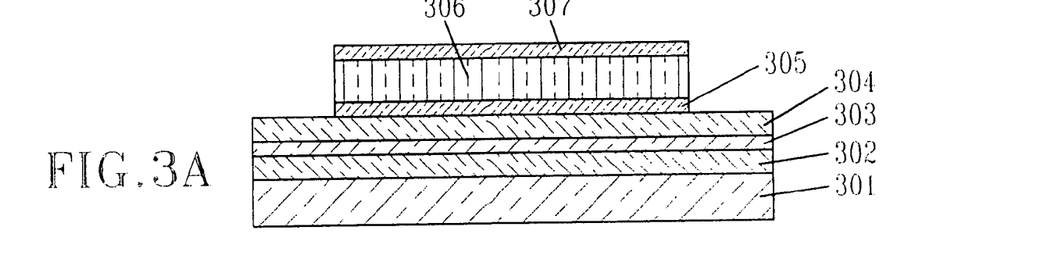
FIGS. 3A-3E are pictorial representations (through cross sectional views) illustrating the basic processing steps used in the present invention for fabricating a strained-silicon-on-insulator.
Figure 3B:
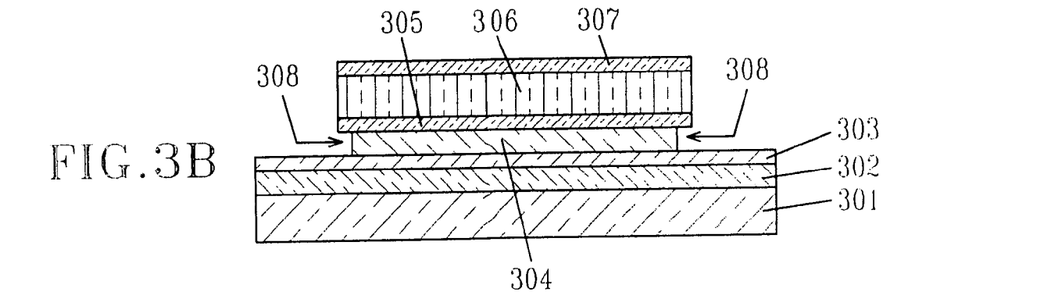
Figure 3C:
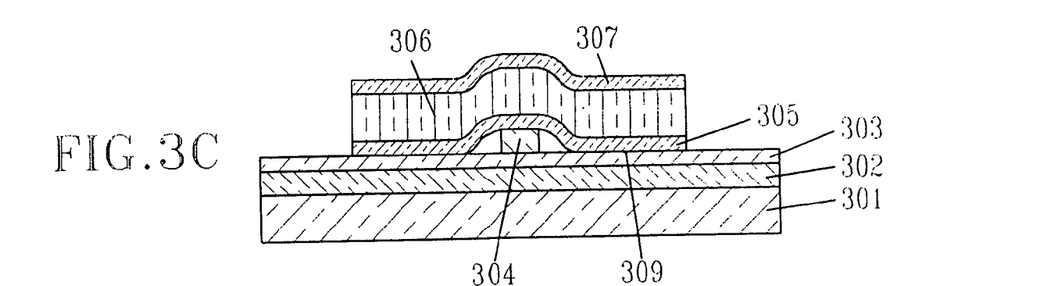
Figure 3D:
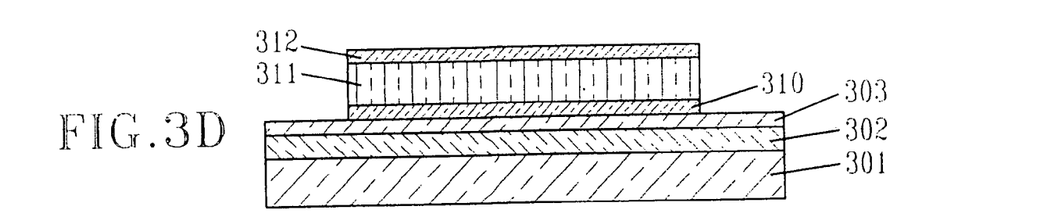
Figure 3E:
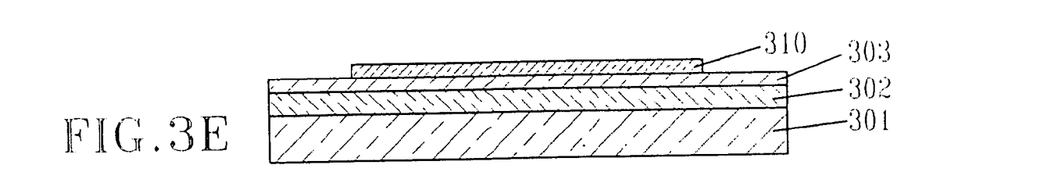

The etch 206 exposes the bottom silicon surface of the SOI film 203, and the top silicon surface of the substrate 201. The exposed silicon surfaces 201 and 203, respectively, are attracted to each other by hydrophobic forces. When enough etching is obtained, the two surfaces will bond as illustrated by FIG. 2C; in this drawing reference numeral 207 denotes bonding between the two surfaces. The combined bonding while etching continues until all the BOX 202 is etched away and the tri-layer micro-slab is fully attached to the substrate as illustrated in FIG. 2D. After removing the structure from the HF bath, the tri-layer slab 208/209/210 remains bonded to the substrate 201 by van der Waals forces. To increase the bond strength, the sample is typically annealed to form a covalent bond (For example, a 250° C. to 650° C. anneal can be used). As shown in FIG. 2E, the top Si film 210 and SiGe film 209 are removed to leave a strained silicon film 208 directly on silicon. A second anneal at a higher temperature than the first anneal (for example, a 650° C. to 1100° C. anneal) may be applied to the sample to further increase the bond strength between layer 208 and the substrate 201.

FIGS. 3A-3E show a variant of the process described in FIGS. 2A-2E, for making strained-silicon on insulator. The starting wafer has a double SOI stack that comprises a first BOX 302, a first SOI film 303, a second BOX 304, a second SOI film 305, a pseudomorphic SiGe film 306, and a silicon cap layer 307. The double SOI wafer can be fabricated by methods such as wafer bonding with the handle wafer being a SOI wafer (bonded or SIMOX). Since the strained SOI film 310 is bonded to the first SOT 303 which lays on an insulator 302 (FIG. 3D), the realized structure is that of strained-silicon on silicon-on-insulator. The first SOI film 303 thickness depends on the device requirements. For example, if fully depleted SOI devices are required then the combined thicknesses of the first SOI film 303 and the second SOI film 305 should be below the maximum depletion width, $X_{dmax}$ ($X_{dmax}=\text{sqrt}(4*\epsilon_{Si}*\phi_f/q/N_a)$), where $\phi_f=kT/q*\ln(N_a/n_i)$, k is the Boltzmann constant, T is the temperature, q is the electron charge, $N_a$ is the doping concentration, $n_i$ is the intrinsic carrier concentration, and $\epsilon_{Si}$ is the dielectric constant of silicon. The additional silicon provided by the first SOI film 303 allows to decouple the device body thickness requirement from the thickness requirement for the strained Si layer, thus avoiding "strain constraints". The second SOI film 305 can be made ultra thin to maximize the strain transfer induced by the SiGe film 306 relaxation, while the first SOI 303 is made thicker so that the total required body thickness is achieved. Having a thinner strained Si layer will also minimize strain relaxation during subsequent device fabrication steps that require high temperature annealing.

In the above discussed scenarios, the silicon surfaces that are being bonded are rendered hydrophobic by the HF solution which creates a H-passivated interface. Another approach to induce hydrophobicity to hydrophilic surfaces is by adsorbing surfactants at the bonding surfaces. Surfactants or surface active agents are amphoteric in nature with a hydrophobic tail and a hydrophilic head group. Ionic surfactants adsorb at oppositely charged hydrophilic surfaces initially by electrostatic attraction between the headgroups and surface charges, thereby exposing the hydrophobic tails and thus making the surface hydrophobic. However, with increasing concentration of surfactants, double layer structures start forming at the interface and in the process make the surface hydrophilic. Hence, it is very critical to determine the appropriate amount of surfactants required to make a surface hydrophobic.

Figure 6:
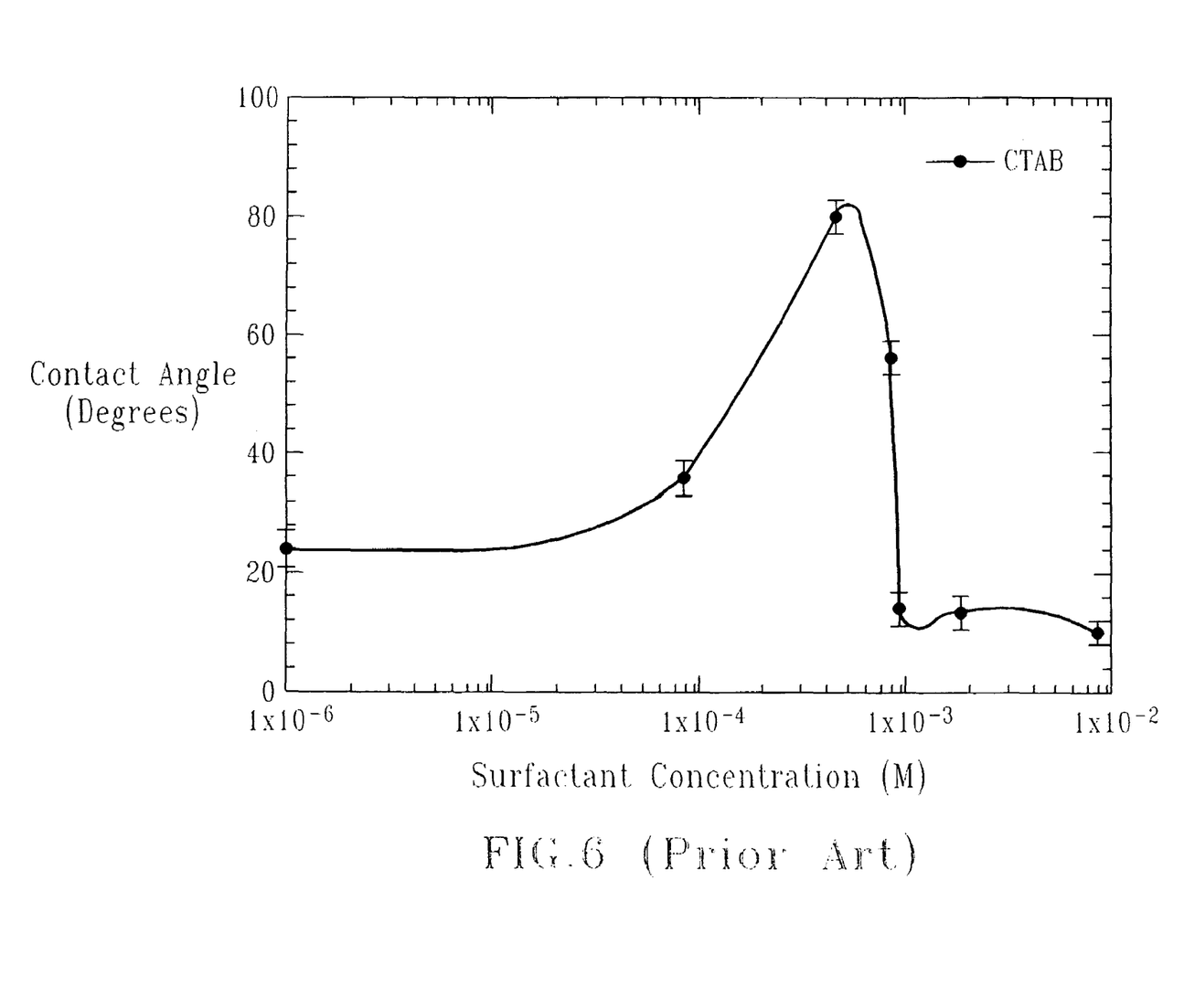
FIG. 6 is a prior art plot showing the hydrophobicity (determined from measurements of the contact angle between a water droplet and a sample surface) of a mica surface as a function of surfactant concentration.
Figure 7A:
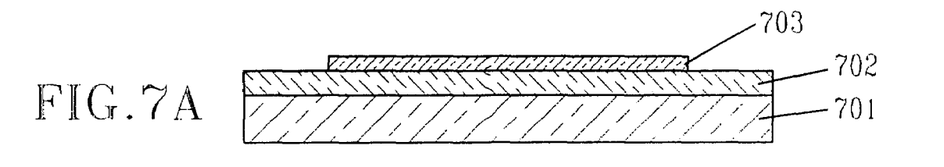
FIGS. 7A-7E are pictorial representations (through cross sectional views) illustrating the basic processing steps used to fabricate a p-n junction by the inventive in-place bonding method.
Figure 7B:
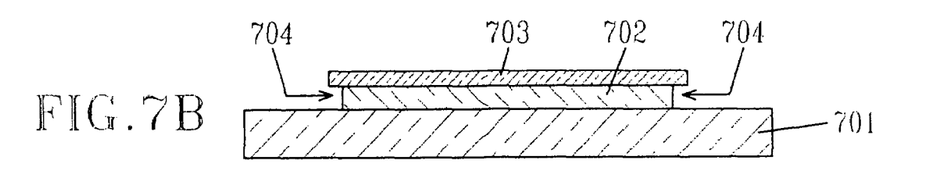
Figure 7C:
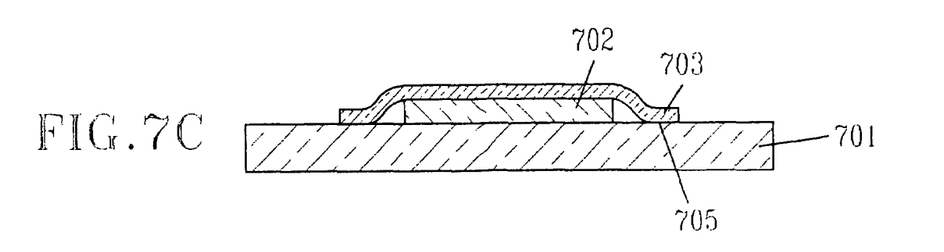
Figure 7D:
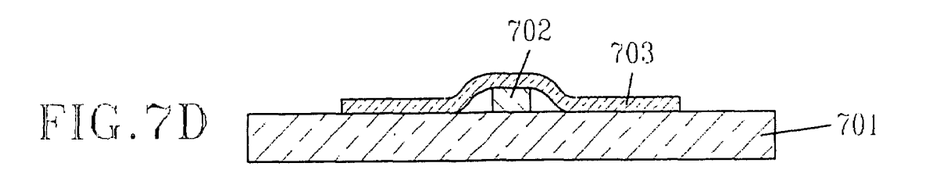
Figure 7E:
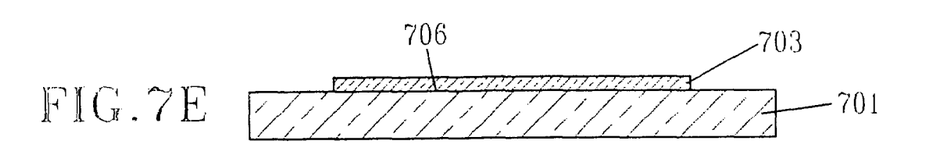

The contact angle between a water droplet and a hydrophilic (mica) surface as a function of surfactant concentration is shown in FIG. 6; reproduced from V. K. Paruchuri, PhD Thesis, "Surface Micelles as Revealed by Soft Contact Atomic Force Microscopy Imaging", Univeristy of Utah, 2004. At low surfactant concentrations, the surfactant adsorbs with the hydrophilic, oppositely charged headgroup in contact with the surface and the hydrophobic tail is exposed towards the solution. Hence, at low surfactant concentrations the mica surface becomes increasingly hydrophobic with increase in surfactant concentration. At higher surfactant concentrations however, the formation of surface micelles occurs. The surface micelles are cylindrical (double layered) in nature, meaning that now surfactant headgroups are exposed to the surface. This results in the decrease of the contact angle and the surface becomes hydrophilic once again. This shows that a maximum hydrophobicity can be induced at a surface by carefully controlling the surfactant concentration. Although, mica surface is shown here as an example, in principle this technique can be applied to make any surface hydrophobic.

A second application of the in-place bonding technique of the present invention is the fabrication of a wafer on which some single-crystal regions have different crystal orientation than that of the substrate. For a p-MOSFET, the hole mobility is known to be 2.5 times higher on a 110-oriented Si wafer than on a standard 100-oriented Si. It would therefore be desirable to create a hybrid substrate comprising 100-oriented Si where n-MOSFETs would be formed, and 110-oriented Si where p-MOSFETs would be formed.

A substrate with hybrid orientations can be realized by applying the inventive method to a SOI wafer where the substrate has a 100 crystal orientation and the SOI film has a 110 crystal orientation. The hybrid 110/100 orientation substrate realized by the technique allows the implementation of bulk silicon technology (as opposed to SOI technology) on both differently orientated regions.

Figure 4A:
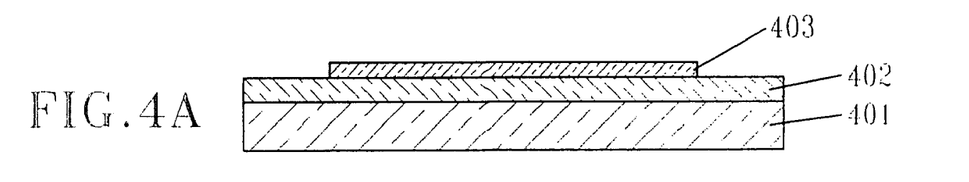
FIGS. 4A-4E are pictorial representations (through cross sectional views) illustrating the basic processing steps used in the present invention for fabricating a hybrid orientation substrate.
Figure 4B:
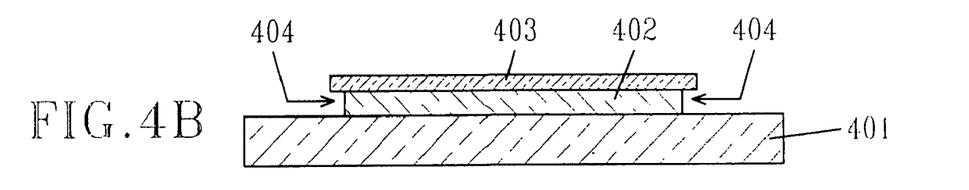
Figure 4C:
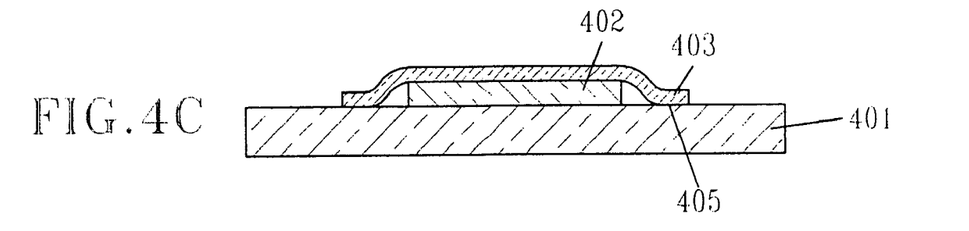
Figure 4D:
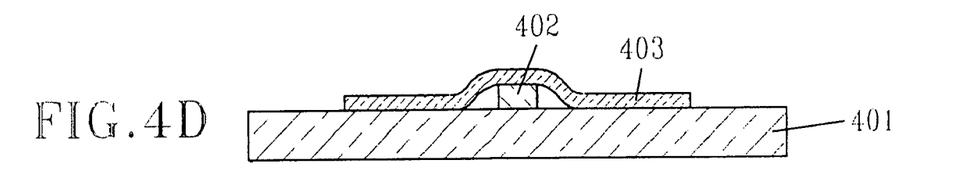
Figure 4E:
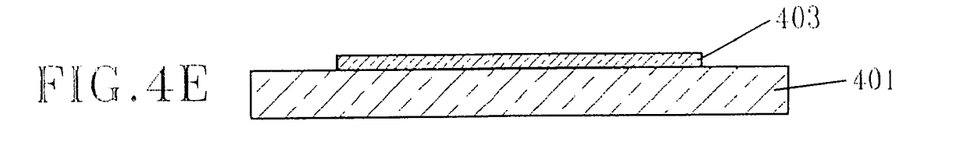

FIG. 4A illustrates a cross-sectional schematic of a silicon substrate 401 having a (100) crystal orientation, a buried oxide 402, and SOI micro-slabs 403 having a (110) crystal orientation. The buried oxide 402 is etched 404 as shown in FIG. 4B to undercut the SOI micro-slabs 403. As the etch progresses, the exposed silicon substrate 401 and micro-slabs 403 bond 405, as shown in the time sequence of FIGS. 4C and 4D. When all the buried oxide is etched away, the (110) oriented silicon slabs are fully bonded to the (100) oriented silicon substrate 401, as illustrated by FIG. 4E. Since the silicon micro-slabs can be made very thin (for example, 1-50 nm), for practical silicon processing the top surface of the micro-slabs 403 can be considered as being leveled with the top surface of the silicon substrate 401. Thus, p-MOSFETs on (110) oriented silicon micro-slabs can be fabricated next to n-MOSFETs on the (100) oriented substrate.

In general the method of the present invention can be further extended to form a hybrid semiconductor wafer. For example, if the SOI film is replaced with germanium (Ge) film then the resulting wafer will have Ge micro-slabs bonded to a silicon surface.

Figure 5A:
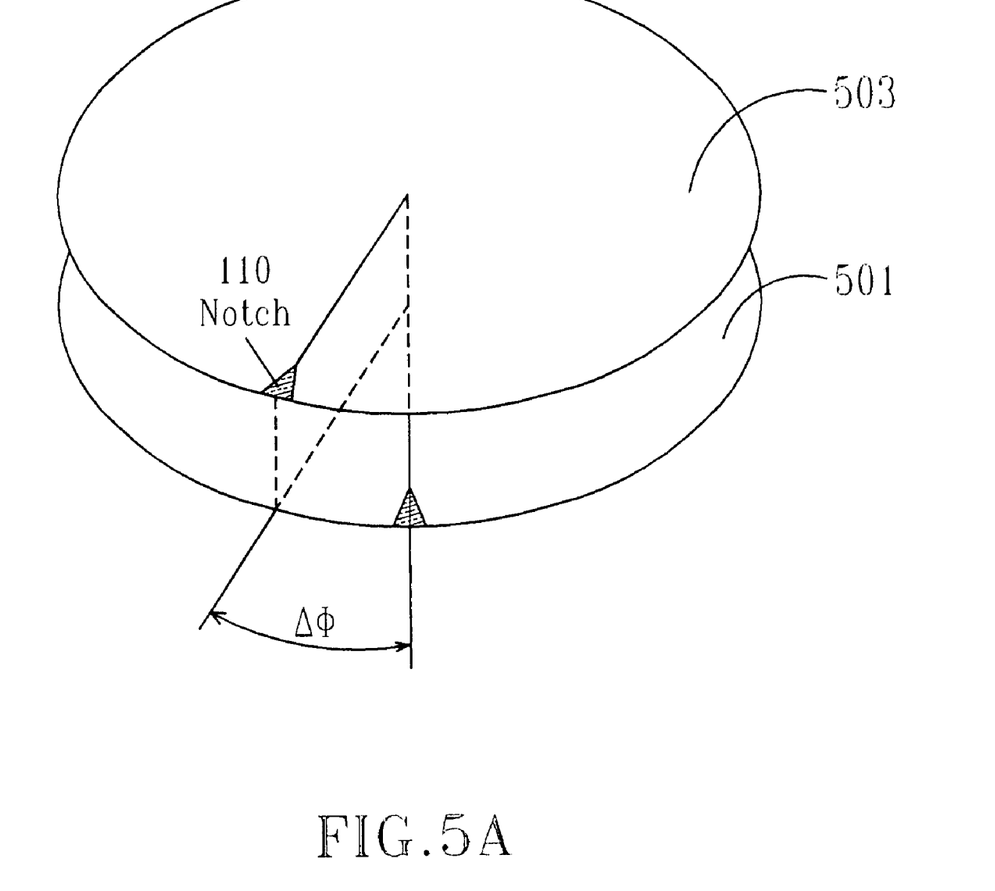
FIG. 5A shows a twist bonded wafer pair. The notches of the wafers are rotationally misaligned with respect to each other by $\Delta\Phi$ degrees in the plane of the substrate.
Figure 5B:
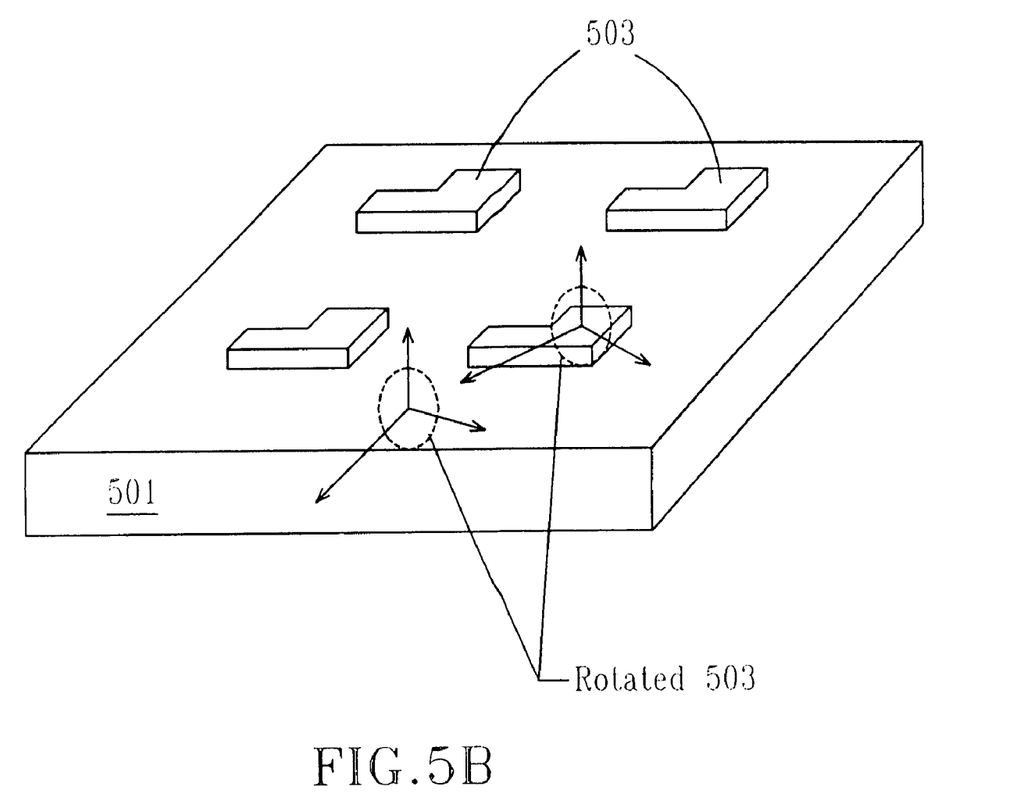
FIG. 5B is a schematic illustrating bonded wafer features that were in-place bonded using a SOI wafer formed by bonding and layer transfer of two wafers. The bonded features are rotationally misaligned (in the plane of the substrate) with respect to the bottom substrate.

A third application of the in-place bonding technique of the present invention is the fabrication of micro-slabs with periodic strain. When two wafers are twist bonded (i.e., the in-plane crystal axis of one wafer is rotated with respect to the same crystal axis in the other wafer, such that the wafer notches are misaligned by some angle phi as shown in FIG. 5A), the misalignment induces a periodic strain at the bonded interface. The periodicity of the strain is controlled by the amount of angular rotation. The strain can be sensed on the surface of the transferred film only if the film is very thin (a few nanometers). An experimental demonstration of twisted hydrophobic bonding of two full wafers followed by the thinning of the transferred layer was reported by R. A. Wind in Appl. Phys. Lett., 78(15), p. 2205, 2001. The technique disclosed in the present invention is suitable for bonding ultra thin micro-slabs to the silicon substrate. The crystal axes of the micro-slabs can be rotated with respect to the substrate as illustrated in FIG. 5B, so that a periodic strain will form at the bonding interface. In the drawings, reference 503 denotes bonded features and reference numeral 501 denotes the semiconductor substrate.

A fourth application of the in-place bonding technique of the present invention is the fabrication of p-n junctions by bonding a doped micro-slab with one carrier polarity to a substrate having an opposite carrier polarity. Since the bonding is performed in the etching solution by etching the buried oxide and bonding the exposed surfaces of the SOI film and the substrate without ever exposing any of the surfaces to air, the obtained interface is clean and oxide free. Therefore, a high quality p-n junction can be realized between the micro-slab and the substrate. FIGS. 7A to 7E illustrate the main process steps for forming a p-n junction employing the in-place bonding technique of the present invention. If the bonding anneal temperature is kept low enough to suppress dopant diffusion, very abrupt junctions can be obtained.

It is again emphasized that the in-place bonding technique of the present invention can be used to bond any surfaces that can be attracted to each other in which a sacrificial layer located there between can be selectively etched, as described above. The in-place bonding technique of the present invention is a room temperature bonding process in which bonding is caused by attractive forces such as, for example, van der Waals, hydrophobic and covalent.

The following examples are provided to illustrate some of the embodiments of the present invention in which the in-place bonding method was used. The examples are also provided to illustrate some of the advantages that can be obtained utilizing the in-place bonding method of the present invention.

EXAMPLE 1

Figure 8A:
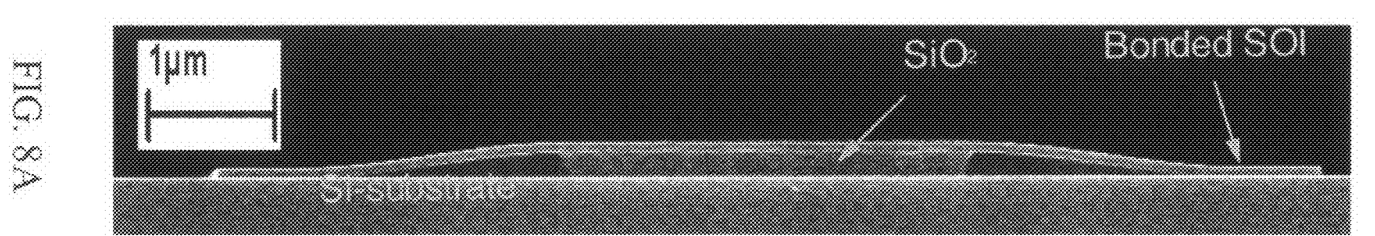
FIGS. 8A-8B show SEM data for the in-place bonding of a 55 nm SOI film.

FIG. 8A shows a scanning electron microscope (SEM) image of a cross section through a micro-slab for which the etching was incomplete (corresponding to FIG. 1C of the invention). The SOI thickness was 55 nm and the buried oxide was 145 nm. The total micro-slab size was about 5×5 microns. The edges of the slab were bonded to the substrate while the center part lies on the unetched portion of the buried oxide.

Figure 8B:
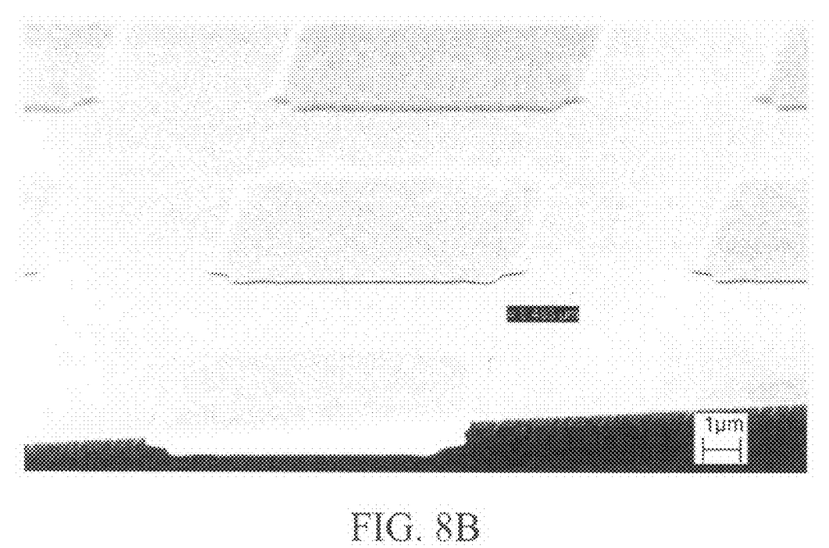

FIG. 8B shows a tilted view, SEM image of a sample for which the etching of the buried oxide was completed. The micro-slabs were 8.5×8.5 microns in size. The SOI thickness was 55 nm. As can be seen and was further confirmed by Atomic Force microscope (AFM) measurements, the micro-slabs lied flat on the substrate. Additionally, the micro-slabs maintained their exact relative position as was before the buried oxide was etched away. The edge of the sample was obtained by cleaving the wafer into two parts. The wafer was not annealed, so the micro-slabs were held to the substrate by van der Waals forces. As can be seen by the overhang of a micro-slab near the wafer edge, the van der Waals force was weak enough to allow delamination of the micro-slab without breaking the micro-slab when the wafer was cleaved.

EXAMPLE 2

Figure 8C:
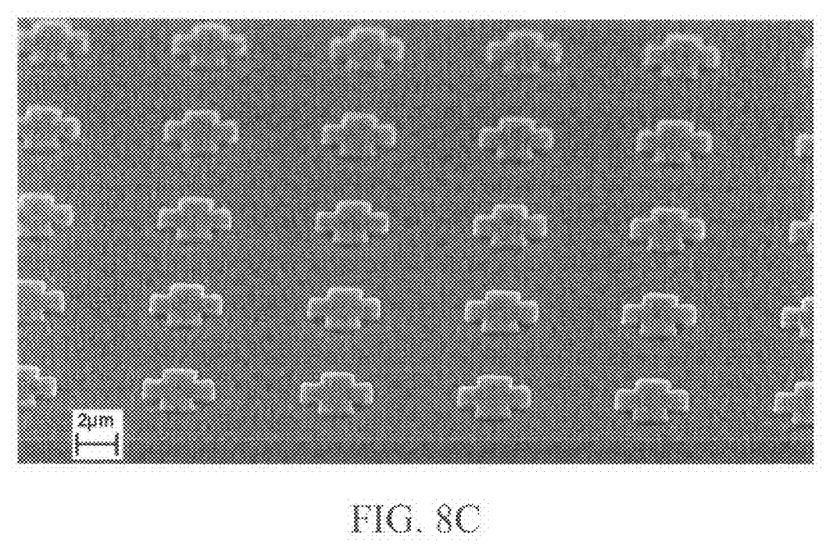
FIG. 8C shows the SEM data for the in-place bonding of a tri-layer Si/SiGe/Si film and FIG. 8D shows an 004 diffraction map taken for the wafer of FIG. 8C. The Bragg angle ($\theta_B$) corresponding to the out-of-place lattice parameter is measured for the different crystalline layers in the sample.
Figure 8D:
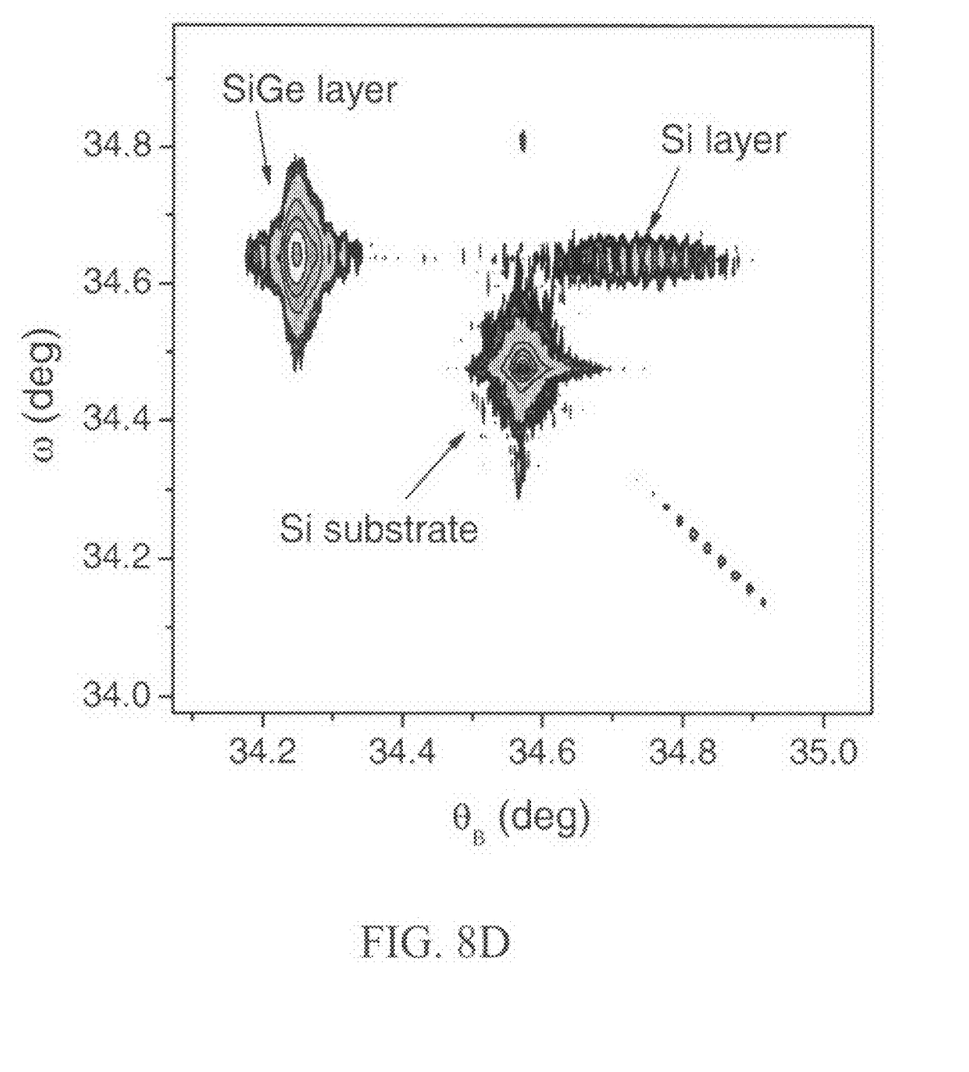

FIG. 8C shows an SEM image of an array of micro-slabs having a gear shape that were bonded using the in-place bonding technique of the present invention. Each micro-slab consisted of a tri-layer film stack of Si/SiGe/Si. The total film stack thickness was about 340 nm with each Si film being about 20 nm thick. The Ge concentration in the SiGe alloy was about 20%. As discussed earlier, the micro-slabs maintained their exact relative position as was before the etching of the buried oxide. The image corresponds to the process step shown in FIG. 2D of the present invention. During the buried oxide etch, the strain in the SiGe film transferred to the top and bottom Si layers. The strain transfer was verified by a high-resolution x-ray diffraction (HRXRD) measurement of the sample, which measures the Bragg angle, $\theta_B$ corresponding to the out-of-plane lattice constant of the different layers in the structure. FIG. 8D shows a 004 diffraction map of the sample shown in FIG. 8C. As can be seen, the Si layer had a larger Bragg angle than that of the substrate, indicating that the Si film was under tensile strain.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a semiconductor structure comprising:

providing a semiconductor substrate comprising a first semiconductor film on a first buried oxide, a second buried oxide formed on the first semiconductor film and a second semiconductor film formed on the second buried oxide;

patterning said second semiconductor film into isolated micro-slabs;

undercutting said second buried oxide utilizing HF as an etchant at room temperature such that the exposed portion of said micro-slabs and said first semiconductor film are bonded by an attractive force selected by a van der Waals force, a hydrophobic force and a covalent force;

etching all the remaining second buried oxide; and annealing at a temperature from 650° to 1100° C. to increase the bond strength and to provide a structure in which the exposed portion of micro-slabs and said semiconductor film are now bonded by a covalent bond.

* * * * *